United States Patent [19]

Mori

[11] Patent Number: 5,473,251
[45] Date of Patent: Dec. 5, 1995

[54] MAGNETIC RESONANCE IMAGING APPARATUS

[75] Inventor: Issei Mori, Tochigi, Japan

[73] Assignee: Kabushiki Kaisha Toshiba, Kanagawa, Japan

[21] Appl. No.: 135,047

[22] Filed: Oct. 12, 1993

[30] Foreign Application Priority Data

Oct. 12, 1992 [JP] Japan .................................. 4-273097

[51] Int. Cl.$^6$ ...................................... G01V 3/00
[52] U.S. Cl. ................... 324/318; 324/322; 128/653.5
[58] Field of Search ..................... 324/318, 322, 324/314, 307, 309, 311; 128/653.5

[56] References Cited

U.S. PATENT DOCUMENTS

| | | | |
|---|---|---|---|
| 4,882,560 | 11/1989 | Young et al. | 324/319 |
| 4,968,937 | 11/1990 | Akgun | 324/318 |
| 4,973,908 | 11/1990 | Bottomley et al. | 324/318 |
| 5,261,403 | 11/1993 | Saito et al. | 324/318 |
| 5,280,248 | 1/1994 | Zou et al. | 324/318 |

*Primary Examiner*—Louis M. Arana
*Attorney, Agent, or Firm*—Ronald L. Yin; Limbach & Limbach

[57] ABSTRACT

A pair of 8-shaped coils vertically sandwiches an object to be examined for providing a magnetic field in the horizontal direction perpendicular to the body axis in the object. A pair of rectangular coils also vertically sandwiches the object for providing a magnetic field in the vertical direction in the object. The pair of 8-shaped coils is connected for detecting a first magnetic resonance signal from the object and the pair of rectangular coils is connected for detecting a second magnetic resonance signal from the object. A phase of one of an output of the pair of 8-shaped coils and an output of the pair of rectangular coils is shifted by 90° and summing a shifted output and the other output. An upper coil assembly of the 8-shaped coil pair and the rectangular coil pair is connected to a lower coil assembly at one end thereof in the lateral direction of the object and is pivotal to be freely opened and closed. To mount the coil assembly to the object, the upper coil assembly is opened, the object is placed on the lower coil assembly, and the upper coil assembly is closed.

25 Claims, 11 Drawing Sheets

MAGNETIC RESONANCE IMAGING APPARATUS

BACKGROUND OF THE INVENTION

1. Field of the Invention

The present invention relates to a magnetic resonance imaging apparatus (to be referred to as an MRI apparatus hereinafter) and, more particularly, an improvement in a radio frequency coil (to be referred to as an RF coil hereinafter) for receiving a magnetic resonance signal from an object to be examined.

2. Description of the Related Art

As an example of such an RF coil, a surface quadrature (QD) coil or a volume QD coil is known. Examples of the volume QD coil are a saddle coil, a slotted tube resonator coil, and the like.

The surface QD coil is suitable for imaging a surface region of the object. However, the surface QD coil does not have a sufficient sensitivity to cover a deep portion of the object, so that it is difficult to image a deep portion of the object with a high S/N ratio.

The volume QD coil has a saddle or cylindrical shape, and an object is placed in the coil. Thus, the volume QD coil has a large size. Even when a small local portion in the object is to be examined, since an unnecessary portion is included in the sensitivity region, unnecessary noise is detected. Hence, the volume QD coil is not suited for obtaining an image of a small local portion with a high S/N ratio.

Figure 1:
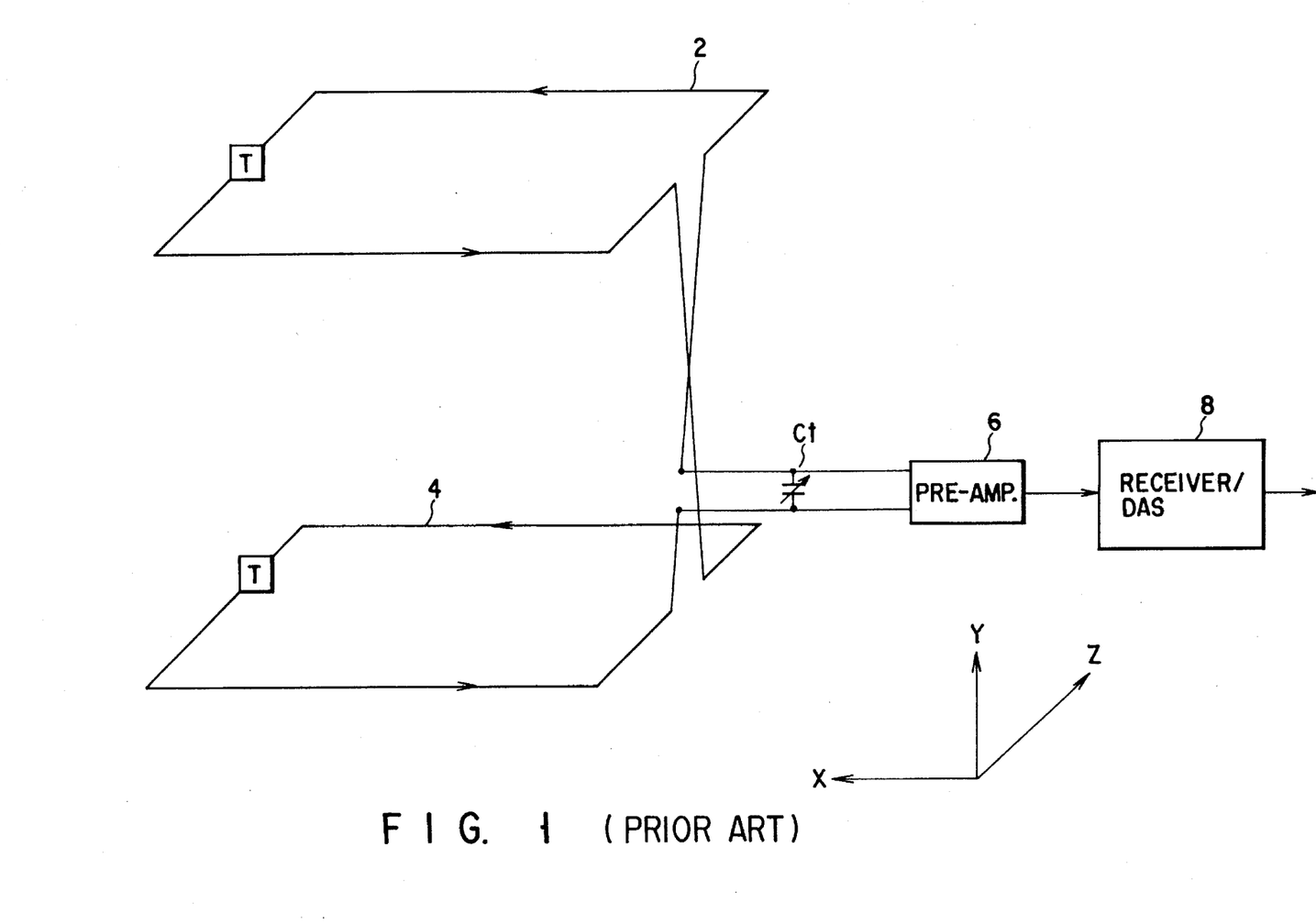
FIG. 1 is a diagram showing the arrangement of a conventional RF coil-pair assembly.

A non-QD coil-pair assembly in which rectangular or circular coils oppose each other is also known. FIG. 1 shows an RF coil-pair assembly in which a pair of rectangular coils 2 and 4 are arranged to oppose each other to sandwich an object (not shown) in order to detect a magnetic resonance (MR) signal from the object. Reference symbols T denote circuits usually called trapping circuits. The trapping circuits T serve to protect circuits connected to the RF coil-pair assembly and to eliminate disturbance in the excited magnetic field caused by an induced current. More specifically, an RF pulse is generated by a transmission coil (not shown) in order to excite the object. An induced electromotive force is generated in the RF coil-pair assembly by the RF pulse. The trapping circuits T prevent a current caused by the induced electromotive force from flowing in the RF coil-pair assembly. Reference symbol Ct denotes a variable tuning capacitor for tuning the resonant frequency of the RF coil-pair assembly to the Larmor frequency of the MRI apparatus. The rectangular coils 2 and 4 are connected to each other to provide an output signal. The output of the RE coil-pair assembly is supplied to a data processor (computer system) for reconstructing an image through a pre-amplifier 6 and a receiver/DAS (data acquisition system) 8.

Figure 2:
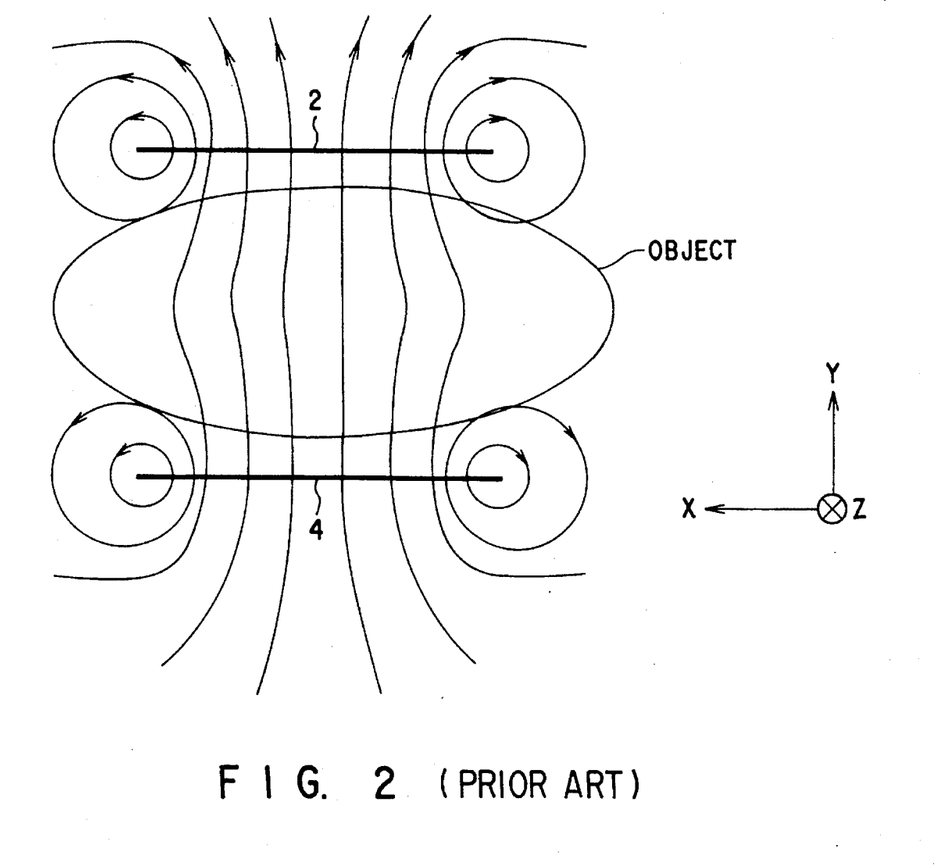
FIG. 2 shows an RF magnetic field generated by the conventional RF coil-pair assembly shown in FIG. 1.

FIG. 2 shows the magnetic distribution (sensitivity distribution) generated by the RF coil-pair assembly. Generally, in an MRI system using a superconducting magnet as a static magnetic field generating unit, the direction of the static magnetic field is the Z direction (the direction of the body axis of the object) and the MRI system is called a horizontal static magnetic field type. Since the RF magnetic field generated by the RF coil-pair assembly of FIG. 1 is Y direction, as shown in FIG. 2, and substantially perpendicular to the static magnetic field (Z direction), it is suitable for examination of the abdomen or the like by an MRI system using a superconducting magnet. In this coil-pair assembly, since the side end portion and its vicinity of the object are not in the sensitivity region, if the region of interest (ROI) is located in the central portion of the coil-pair assembly, unnecessary noise produced by an unnecessary portion is not detected, and the size of the coil assembly is small when compared to that of a volume QD coil.

In an MRI system using a permanent magnet as a static magnetic field generating unit, however, since the direction of the static magnetic field is generally the Y direction (vertical magnetic field), the RF coil-pair assembly having the arrangement shown in FIG. 1, i.e., the RF coil-pair assembly having an RF magnetic field component in the Y direction, as shown in FIG. 2, cannot detect an MR signal.

Furthermore, since this coil-pair assembly is not a QD coil, it cannot perform imaging with a sufficiently high S/N ratio.

In this manner, each of the conventional RF coils, e.g., the surface QD coil, the volume QD coil, the coil-pair assembly, and the like has both advantages and disadvantages, and it is difficult for any of the conventional RF coils to image an ROI with a high S/N ratio.

SUMMARY OF THE INVENTION

Accordingly, it is an object of the present invention to provide a magnetic resonance imaging apparatus capable of reconstructing an image having a high S/N ratio with a simple arrangement and within a short period of time.

According to the present invention, there is provided a magnetic resonance imaging apparatus comprising:

a pair of coils arranged to face each other through an object for providing a magnetic field in a horizontal direction in the object; and means for connecting the pair of loop coils and detecting a magnetic resonance signal from the object.

According to the present invention, there is provided another magnetic resonance imaging apparatus comprising:

a pair of first coils arranged to face each other through an object for providing a magnetic field in the object;

a pair of second coils arranged to face each other through the object for providing a magnetic field which is perpendicular to the magnetic field provided by the pair of said first coils;

means for connecting the pair of said first coils and detecting a first magnetic resonance signal from the object;

means for connecting the pair of said second coils and detecting a second magnetic resonance signal from the object; and means for shifting a phase of one of an output of the pair of said first coils and an output of the pair of said second coils by 90° and summing a shifted output and the other output, thereby providing a single detection signal.

According to a magnetic resonance imaging apparatus of the present invention, since the sensitivity region of the RF coil can cover only a partial ROI without covering the entire object, imaging of a small local portion can be performed with a high S/N ratio. Moreover, since an RF magnetic field perpendicular to a static magnetic field can be generated regardless of whether the static magnetic field is in the vertical or horizontal direction, the present invention can be applied to both MRI systems having the horizontal and vertical magnetic fields.

According to the other magnetic resonance imaging apparatus of the present invention, since a QD coil is composed of two pairs of coils each of which is sandwiching the object, the S/N ratio can be further improved.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE PREFERRED EMBODIMENTS

A preferred embodiment of a magnetic resonance imaging apparatus according to the present invention will now be described with reference to the accompanying drawings.

Figure 3:
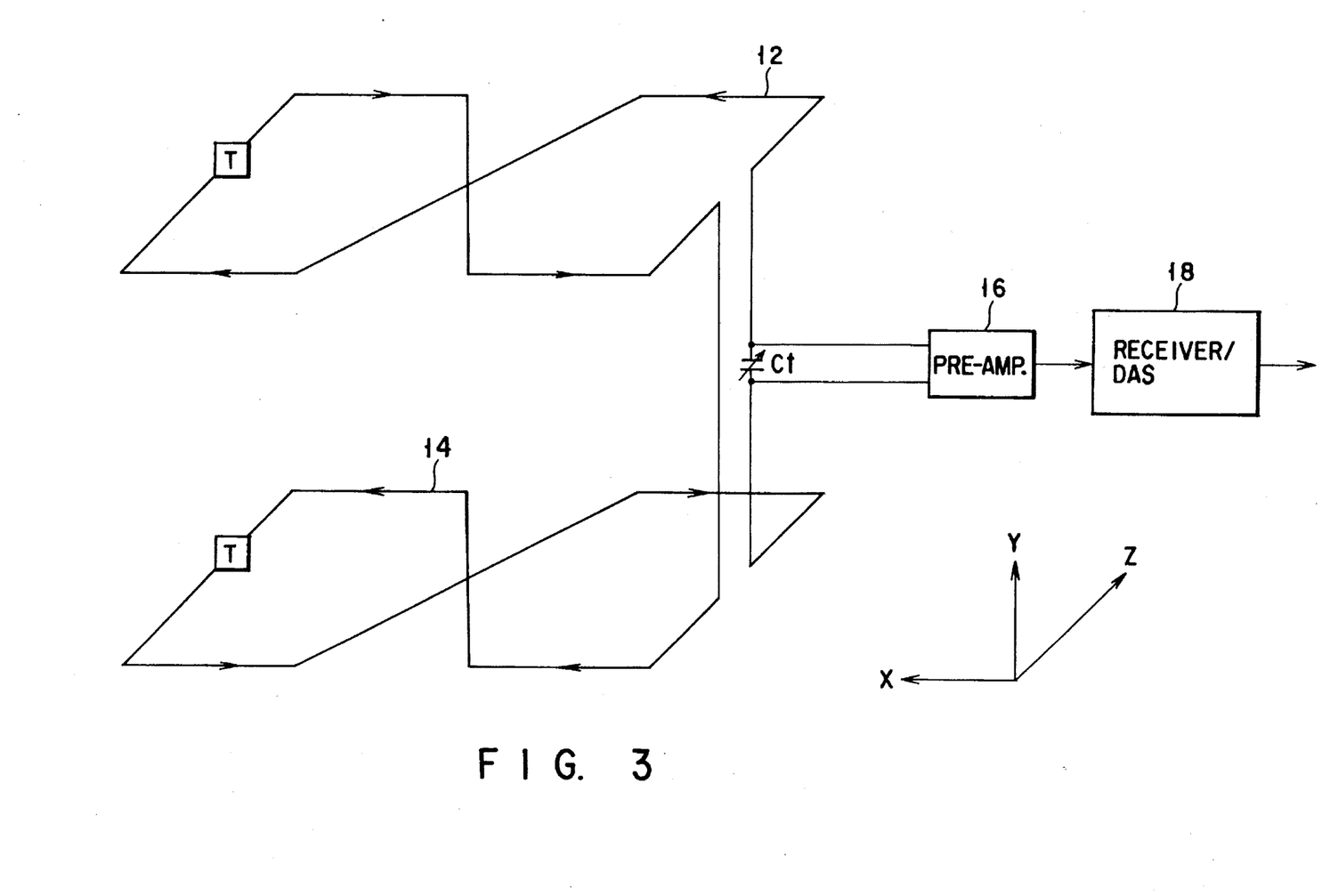
FIG. 3 is a diagram showing the arrangement of an RF coil-pair assembly of an MRI apparatus according to a first embodiment of the present invention.

FIG. 3 shows the arrangement of an RF coil-pair assembly according to a first embodiment of the present invention. A pair of 8-shaped coils 12 and 14 are arranged to vertically sandwich an object to be examined (not shown) lying on a bed, thereby constituting one RF coil-pair assembly. The coils 12 and 14 are connected to each other at their end portions in the lateral direction of the object. An output from the RF coil-pair assembly formed of a pair of 8-shaped coils 12 and 14 is amplified by a pre-amplifier 16 and supplied to a data processor (computer system) as raw data through a receiver/DAS (data acquisition system) 18. The data processor processes the raw data to reconstruct an image. The direction of the body axis of the object is the Z-axis direction. The horizontal direction perpendicular to the z axis will be referred to as the X-axis direction (lateral direction of the object), and the vertical direction perpendicular to the Z axis will be referred to as the Y-axis direction hereinafter.

Figure 4:
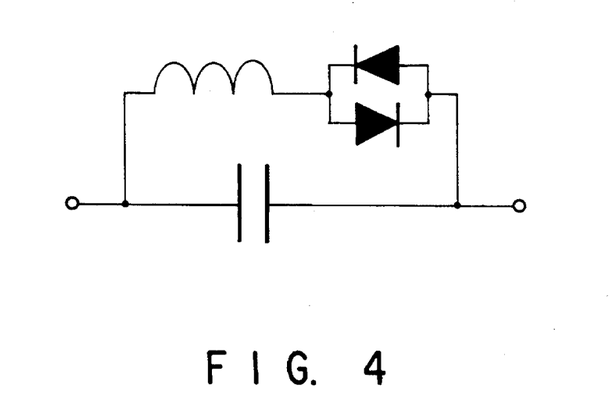
FIG. 4 is a block diagram of a trapping circuit used in FIG. 3.

Trapping circuits T as shown in FIG. 4 are connected to the respective coils 12 and 14. The trapping circuits T prevent an induced electromotive force from being generated by an RF pulse transmitted from a transmission coil (not shown) for exciting the object, so that a current will not flow in the RF coil-pair assembly to disturb the excited magnetic field. The trapping circuits T also protect circuits connected to the RF coil-pair assembly. Note that a variable tuning capacitor Ct for tuning the resonant frequency of the RF coil-pair assembly to the Larmor frequency of the MRI system is connected to the input of the pre-amplifier 16.

Figure 5:
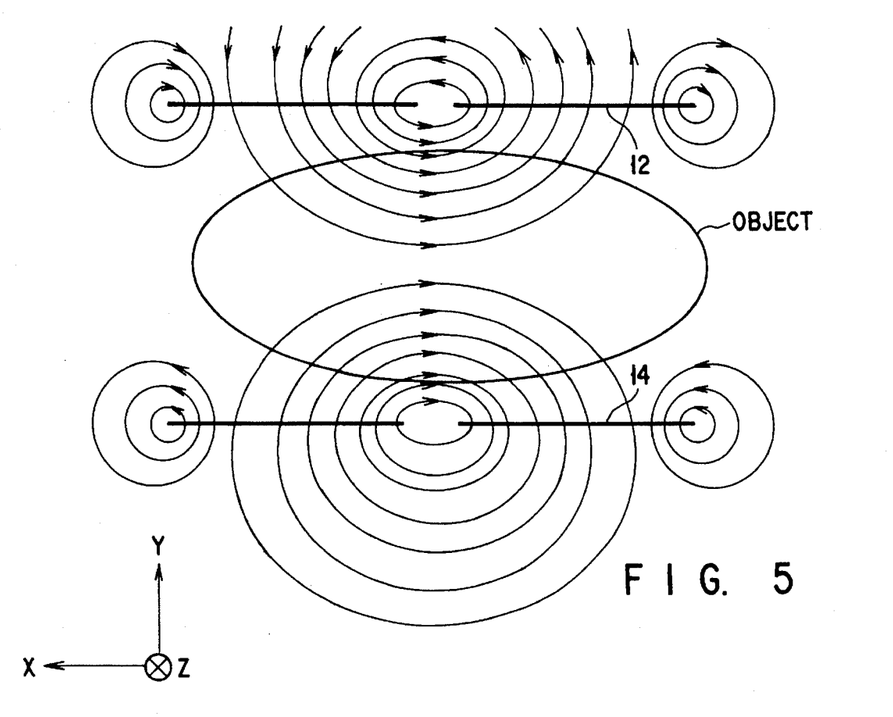
FIG. 5 shows an RF magnetic field generated by the RF coil-pair assembly of the first embodiment.

FIG. 5 shows an RF magnetic field generated by this RF coil-pair assembly. In the object, lines of magnetic force are directed in substantially the X direction. Thus, the RF coil-pair assembly can detect an MR signal from the object even if the static magnetic field is directed in the Y or Z direction. Therefore, the RF coil-pair assembly of the first embodiment can generate an RF magnetic field in a direction perpendicular to the direction of the static magnetic field both when it uses a superconducting magnet and a permanent magnet as the static magnetic field generating unit, and the RF coil-pair assembly can detect an MR signal in the MRI system of the vertical or horizontal magnetic field.

Figure 6:
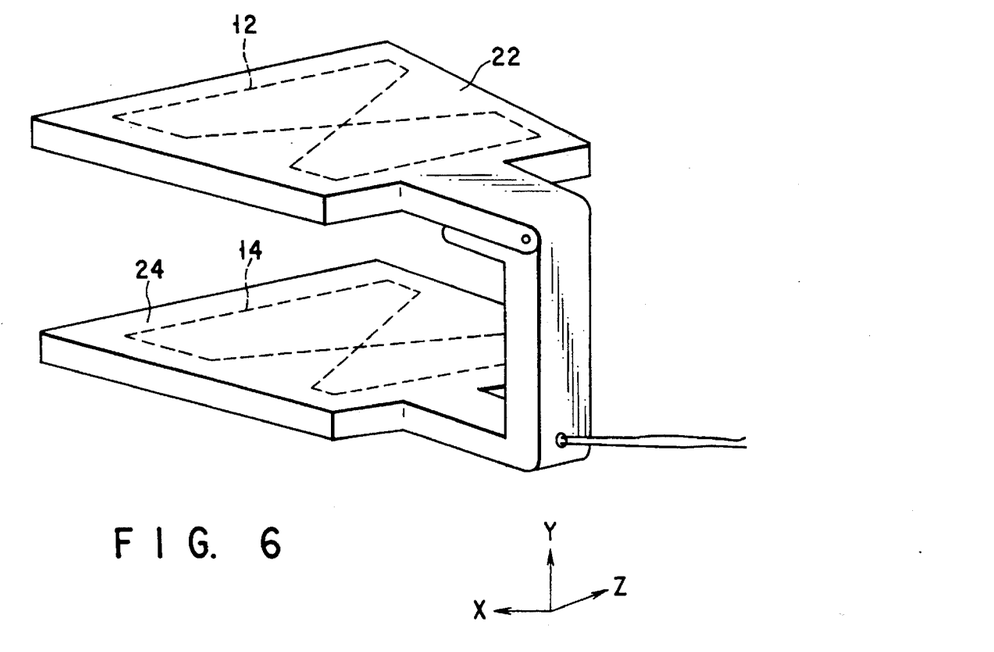
FIG. 6 is a view showing the outer appearance of the RF coil-pair assembly of the first embodiment.

FIG. 6 shows the outer appearance of the RF coil-pair assembly. Two plate-like members 22 and 24 made of, e.g., polyethylene, and having a high insulating degree and a low dielectric constant are connected such that their sections constitute a U shape. The 8-shaped coils 12 and 14, together with the trapping circuits T, are buried in the plate-like members 22 and 24, respectively. Note that the variable tuning capacitor Ct can also be buried in the plate-like member 22 or 24.

Figure 7:
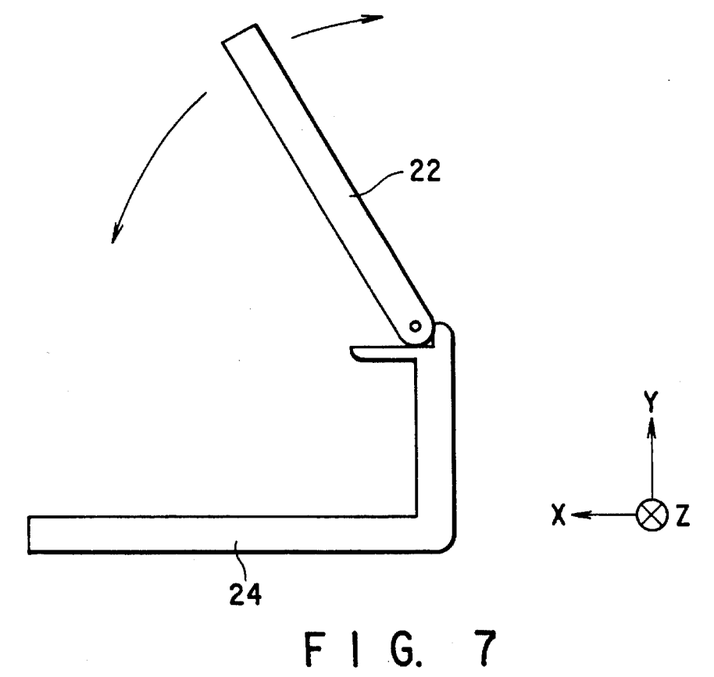
FIG. 7 is a view of the RF coil-pair assembly of FIG. 6 when viewed from the Z-axis direction.

As shown in FIG. 7, of the two plate-like members 22 and 24, the upper plate-like member 22 is pivotal to be opened or closed at its one end portion in the X direction. When this RF coil-pair assembly is mounted to a bed, the upper plate-like member 22 is opened, the object is laid on the lower plate-like member 24, and thereafter the upper plate-like member 22 is pivoted down to a predetermined position. When the upper plate-like member 22 is pivoted down to this predetermined position, the RF coil-pair assembly is set in a state shown in FIG. 6.

Figure 8:
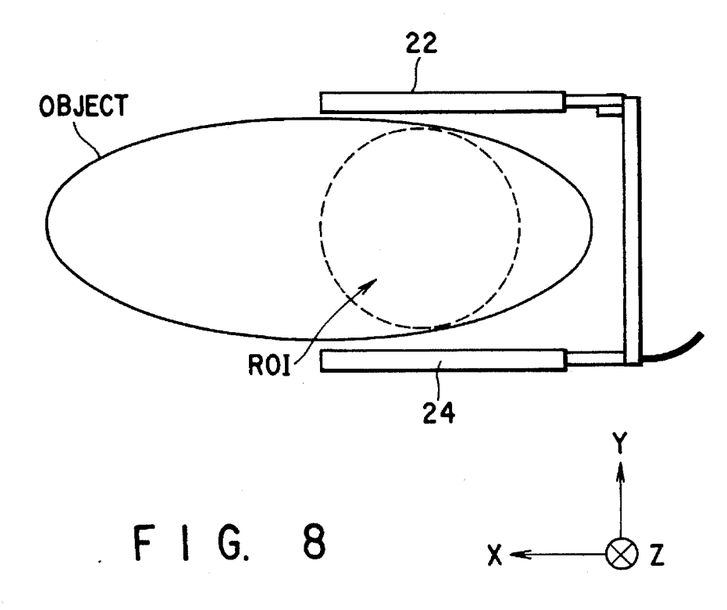
FIG. 8 is a view showing an actual mounting state of the RF coil-pair assembly of the first embodiment.

With this arrangement, when an ROI is a small local portion in the object, MR imaging can be performed even if the width (a size in the X direction) of the RF coil-pair assembly is much smaller than the width of the object. FIG. 8 shows this state. This means that a small local portion of the object can be imaged with a high S/N ratio. This is because the RF magnetic fields generated by this RF coil-pair assembly are concentrated on part (region of interest) of the object and that noise from other regions are not much received. If a magnetic field generated by the RF coil-pair assembly exists in an unnecessary portion which is not the ROI or if the RF coil-pair assembly has a sensitivity region covering the unnecessary portion, the S/N ratio of the ROI is decreased. Therefore, it is apparent that the RF coil-pair assembly of the first embodiment enables MRI examination of the ROI with a higher S/N ratio than that of a conventional volume coil. The first embodiment is suitable for diagnosis of the pancreas and the like.

As described above, according to the first embodiment, an RF magnetic field perpendicular to the static magnetic field can be generated regardless of whether the static magnetic field is the vertical or horizontal magnetic field. The present invention can be used in the MRI systems of both types, and it can image only a small region in a deep portion in the object with a high S/N ratio. Hence, a compact RF coil-pair assembly can be realized. Generally, in order to increase the S/N ratio, a pulse sequence for acquiring the same MR signal a plurality of times and obtaining an average of the acquired MR signals is utilized. In this case, since the S/N ratio of the RF coil-pair assembly is higher than that of the conventional RF coil, the number of times of the acquiring operation can be decreased and the imaging time can be shortened.

Figure 9:
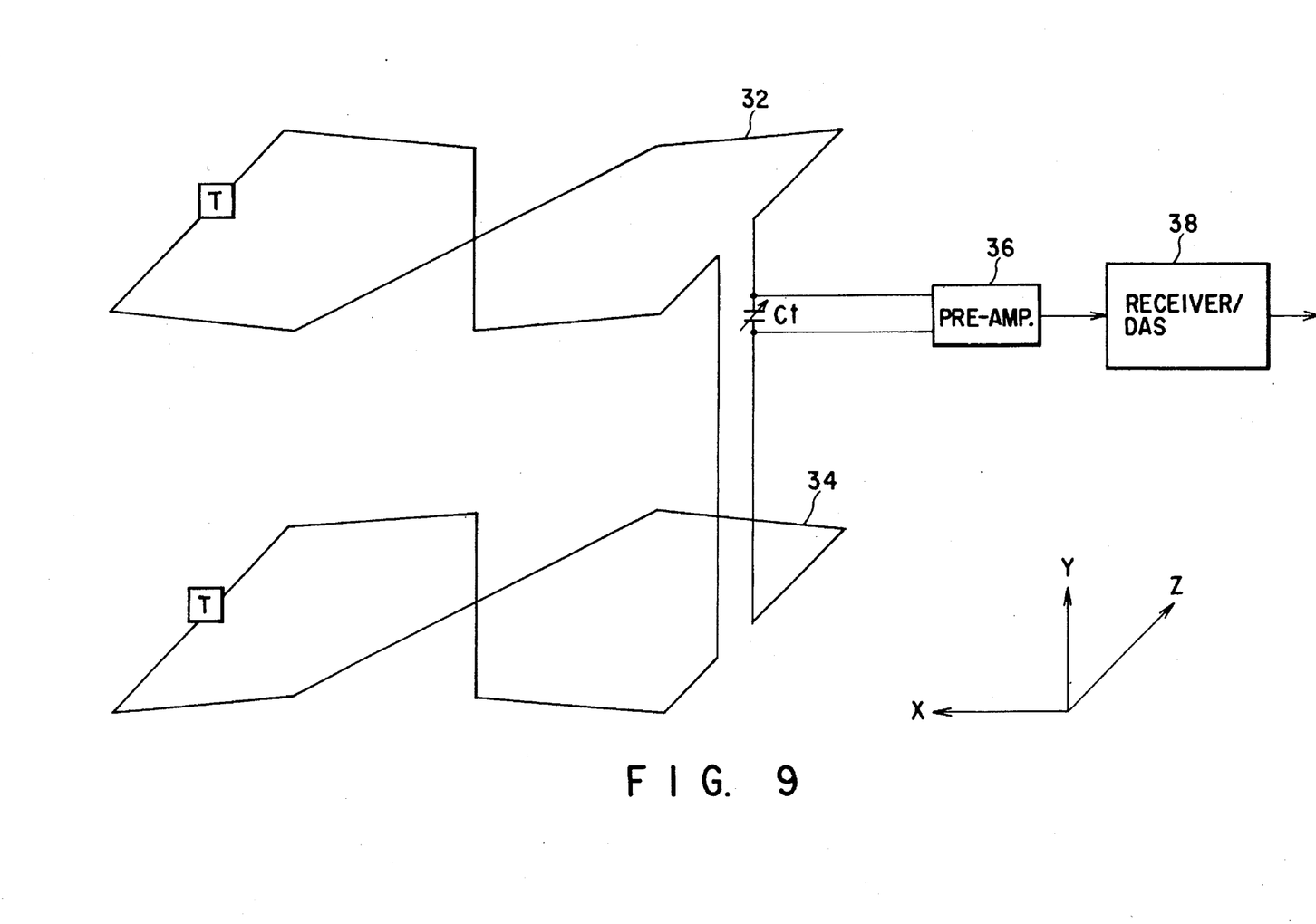
FIG. 9 is a diagram showing the arrangement of an RF coil-pair assembly of an MRI apparatus according to a second embodiment of the present invention.

FIG. 9 shows an RF coil-pair assembly according to a second embodiment of the present invention. In the first embodiment, the 8-shaped coils 12 and 14 are formed in planar substrates parallel to each other. Whereas, portions of 8-shaped coils 32 and 34 of the second embodiment at the two ends in the X direction are set farther from the object than in the first embodiment. More specifically, the gap between the 8-shaped coils 32 and 34 is set larger at portions closer to the right and left end portions of the object. Thus, the central portion of the 8-shaped coils 32 and 34 is narrowed.

Figure 10:
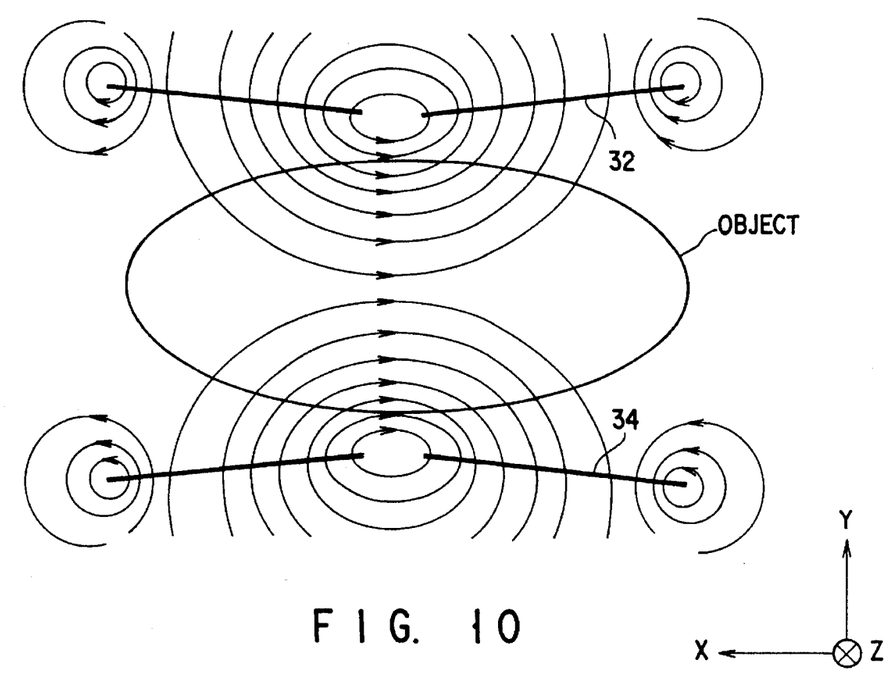
FIG. 10 shows an RF magnetic field generated by the RF coil-pair assembly of the second embodiment.

FIG. 10 shows a magnetic field generated by this RF coil-pair assembly. When a portion near the center of the object is considered, the direction of the magnetic field generated by the conductor portions at the two ends in the X direction is a direction to cancel, although weakly, the magnetic field generated by the conductor portions at the central portion in the X direction. That is, the sensitivity near the center of the object is decreased. Furthermore, magnetic fields having a certain degree of strength are concentrated near the conductor portions at the two ends in the X direction. If the object is located near these portions, the RF coil-pair assembly receives unnecessary noise. However, considering a fact that a portion of the object concerning diagnosis is not generally located near the conductor portions at the two ends in the X direction, according to the second embodiment, when the conductor portions at the two ends in the X direction are located away from the object, the sensitivity in the vicinity of the center of the object can be slightly increased, and unnecessary noise caused at the end portion of the object can be decreased, so that the S/N ratio in the vicinity of the center of the object can be increased.

In the second embodiment, the two plate-like members may be connected such that their sections constitute a U shape and that the upper half is pivotal to be opened and closed at its one end portion in the X direction, in the same manner as in the first embodiment shown in FIGS. 6 and 7. In this case, the gap of the two plate-like members is narrow at the central portion and wider at portions closer to the end portions of the plate-like members.

Figure 11:
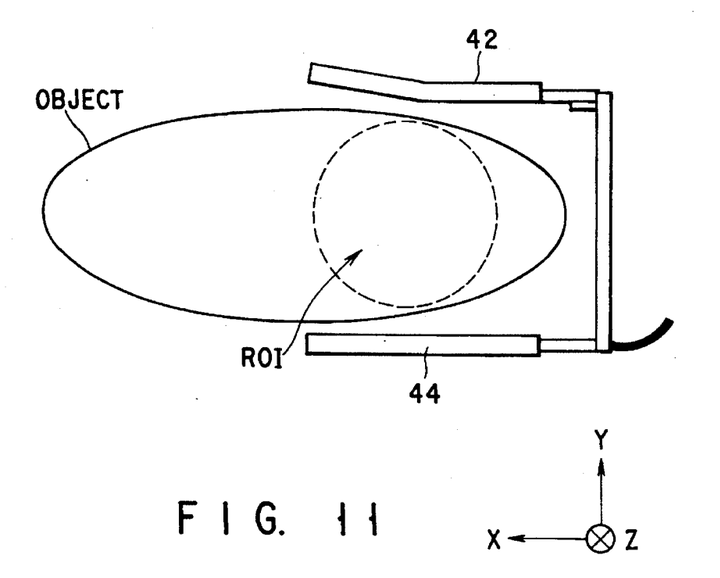
FIG. 11 is a view showing an actual mounting state of the RF coil-pair assembly of the second embodiment.

Furthermore, the second embodiment can be modified as shown in FIG. 11. For the sake of convenience in installation on a top plate of a bed and comfort of the object, a lower plate-shaped member 44 is flat and a conductor portion of an upper plate-shaped member 42 at the open end side is set apart from the object. The proximal end portion side of the upper plate-shaped member 42 is parallel to the plate-shaped member 44.

Figure 12:
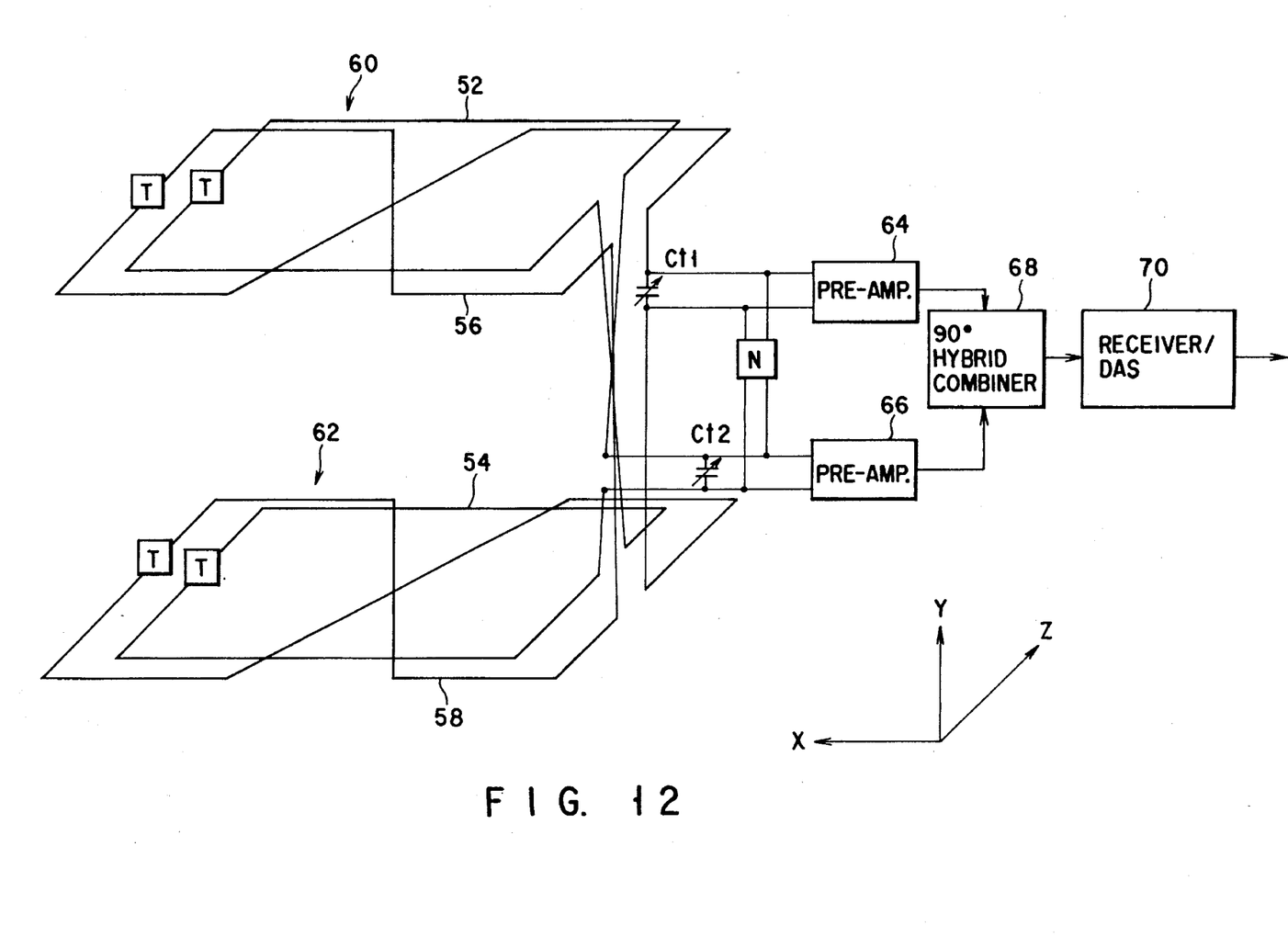
FIG. 12 is a diagram showing the arrangement of an RF coil-pair assembly of an MRI apparatus according to a third embodiment of the present invention.

FIG. 12 shows the arrangement of an RF coil-pair assembly according to a third embodiment of the present invention. In the first and second embodiments, a pair of 8-shaped coils are arranged to oppose each other for forming an RF coil-pair assembly. In the third embodiment, two sets each comprising a pair of coils are provided to constitute so-called a pair of QD coils for obtaining a composite signal of output signals from the two pairs of coils. More specifically, a first pair of rectangular or circular coils 52 and 54 (channel A) and a second pair of 8-shaped coils 56 and 58 (channel B) are provided to form a pair of QD coils 60 and 62. Although the first pair of coils comprises rectangular coils, it can comprise circular coils. The first pair of rectangular coils 52 and 54 provides a magnetic field in the vertical direction in the object and the second pair of 8-shaped coils 56 and 58 provides a magnetic field in the horizontal direction in the object. As a result, the directions of the magnetic fields generated by the first and second pairs of coils are substantially perpendicular to each other, the coil assembly comprising these pairs of coils can be operated as QD coil assembly. The outputs from the respective pairs of coils are amplified by pre-amplifiers 64 and 66 in units of channels and input to a 90° hybrid combinet 68 to be summed. The output of the 90° hybrid combinet 68 is supplied as raw data to a data processor (computer system) for reconstructing an image through a receiver/DAS 70. Variable tuning capacitors Ct1 and Ct2 are connected to the corresponding channels. The 90° hybrid combinet 68 adds one input thereto to the other input thereto with a phase shift of 90° and is widely used in QD coils.

Figure 13:
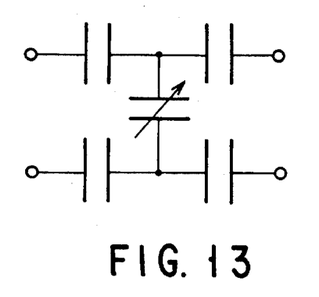
FIG. 13 is a circuit diagram of a neutralization circuit of FIG. 12.

A neutralization circuit N is connected between outputs from the coils of the two channels. The neutralization circuit N is a capacitor bridge circuit for removing interference between the respective channels and has an arrangement as shown in FIG. 13. The neutralization circuit N is described in detail in U.S. Pat. No. 4,769,605.

Figure 14:
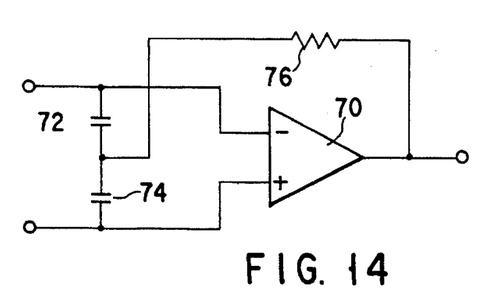
FIG. 14 is a circuit diagram of a pre-amplifier of FIG. 12.

Each of the pre-amplifiers 64 and 66 comprises a resistor negative feedback amplifier, as shown in FIG. 14, and has not only an amplification function but also a function of decreasing interference between the respective channels. An input signal to each preamplifier 64 or 66 is output through an operational amplifier 70. A capacitive current distributor comprising a series circuit of capacitors 72 and 74 is connected between the two input terminals of the operational amplifier 70, and a negative feedback resistor 76 is connected between the output terminal of the operational amplifier 70 and the tap of the capacitors 72 and 74. Then, the apparent Q value of the coils can be decreased. As a result, the electromagnetic interference between the two channels can be suppressed. When the pair-coil assembly has an openable structure having an outer appearance as shown in FIG. 7, the electromagnetic interference between the channels A and B is not completely reproduced due to the reason of mechanical reproducibility. Then, the neutralization circuit N is not in the optimally adjusted state, and the interference cannot be completely removed. However, since the pre-amplifiers 64 and 66 have the interference suppressing function, the interference can be sufficiently suppressed to a low level even if the pair-coil assembly has the structure as shown in FIG. 7. An example of the pre-amplifier 64 or 66 is described in U.S. Pat. No. 5,051,700.

In the first and second embodiments, the pre-amplifiers 16 and 36 are not described in detail. Since these embodiments do not require a function of removing interference between channels, the pre-amplifiers 16 and 36 need only a simple amplification function, and general amplifiers are sufficiently used as the pre-amplifiers 16 and 36.

As described above, according to the third embodiment, since a QD coil is composed of two pairs of coils each of which sandwiching the object, the sensitivity covers a deep portion to a certain degree. Also, since an unnecessary portion of the object is not included in the sensitivity region, imaging of a small local portion, e.g., the shoulder, prostate, chest, cervix uteri, and the like can be performed with a high S/N ratio.

Figure 15:
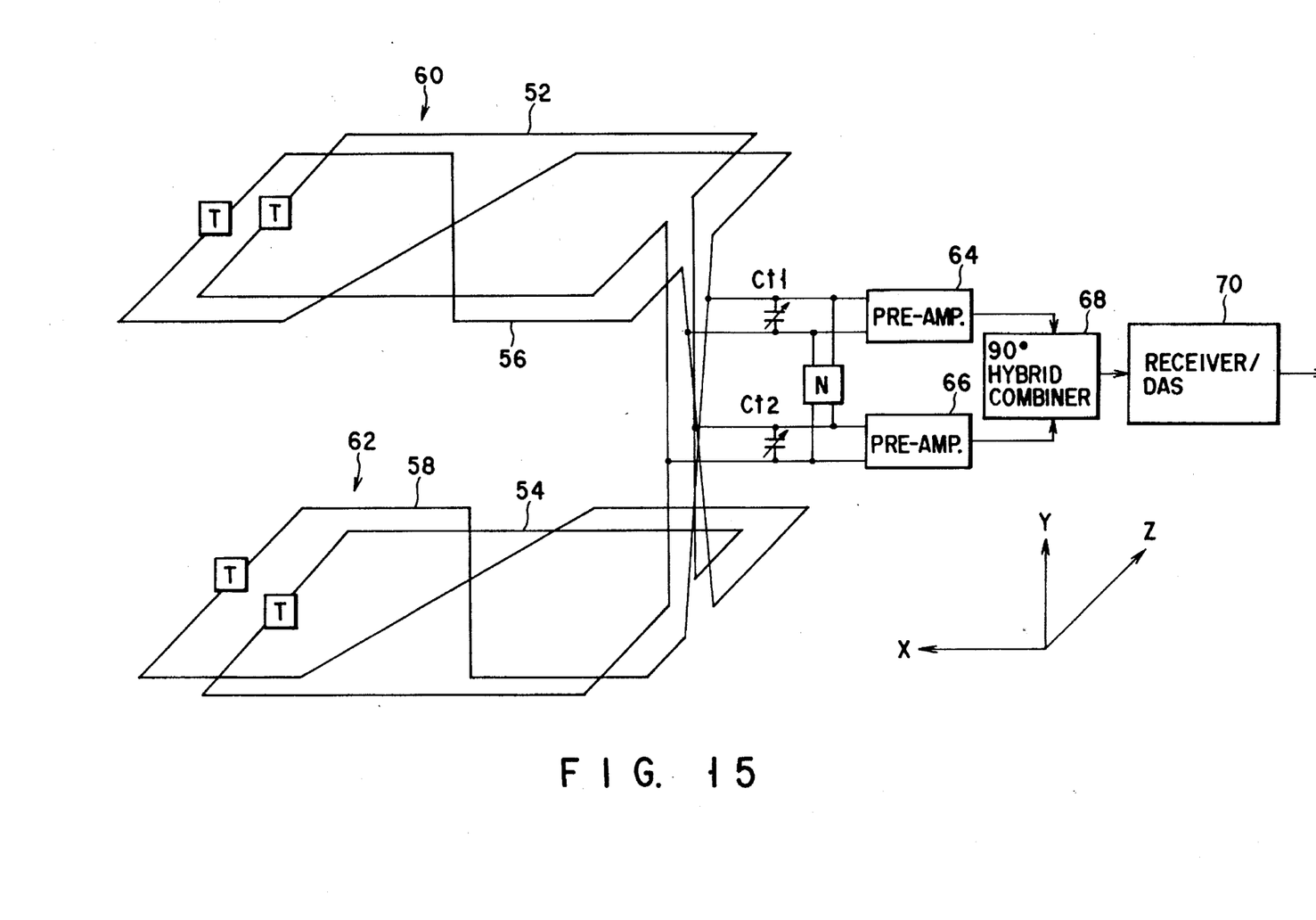
FIG. 15 is a diagram showing a modification of the RF coil-pair assembly of the third embodiment of the present invention.

The third embodiment can be modified as shown in FIG. 15. FIG. 15 is essentially the same as the third embodiment of FIG. 12 and is different from it only in connection of the coils. More specifically, in the third embodiment of FIG. 12, the pair of 8-shaped coils are connected parallel with each other while the pair of rectangular coils are cross-connected. In the modification of FIG. 15, a pair of rectangular coils are connected parallel with each other while a pair of 8-shaped coils are cross-connected.

Figure 16A:
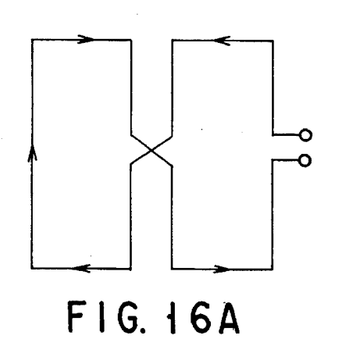
FIGS. 16A to 16E are plan views, respectively, of the 8-shaped coil of the first, second, and third embodiments of the present invention.
Figure 16B:
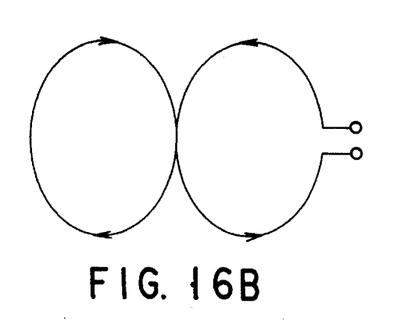
Figure 16C:
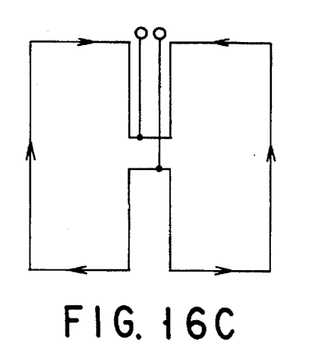
Figure 16D:
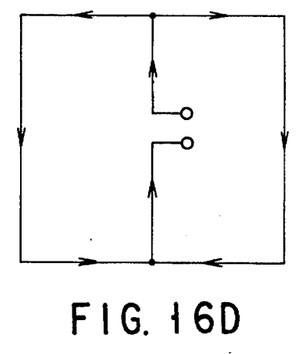
Figure 16E:
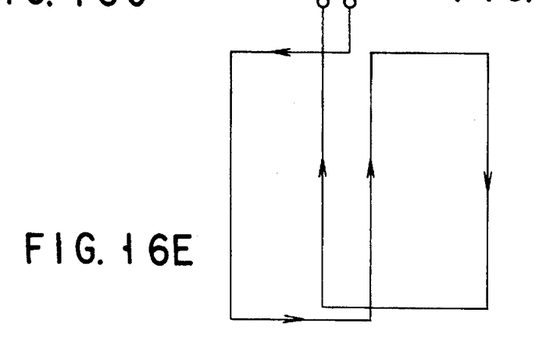

FIGS. 16A to 16E show modifications of the 8-shaped coil of the above embodiment. The oblique portion of the 8-shaped coil of the above embodiment may be shortened, as shown in FIG. 16A. The 8-shaped coil may be a round coil to form a literally 8-shaped coil, as shown in FIG. 16B. Alternatively, a double-rectangular coil, consisting of straight portions, for receiving power at its central portion, as shown in FIG. 16D, may be employed. The arrangements shown in FIGS. 16C and 16E may be used in the same manner as that of FIG. 16A and are thus included in the category of 8-shaped coils.

Figure 17:
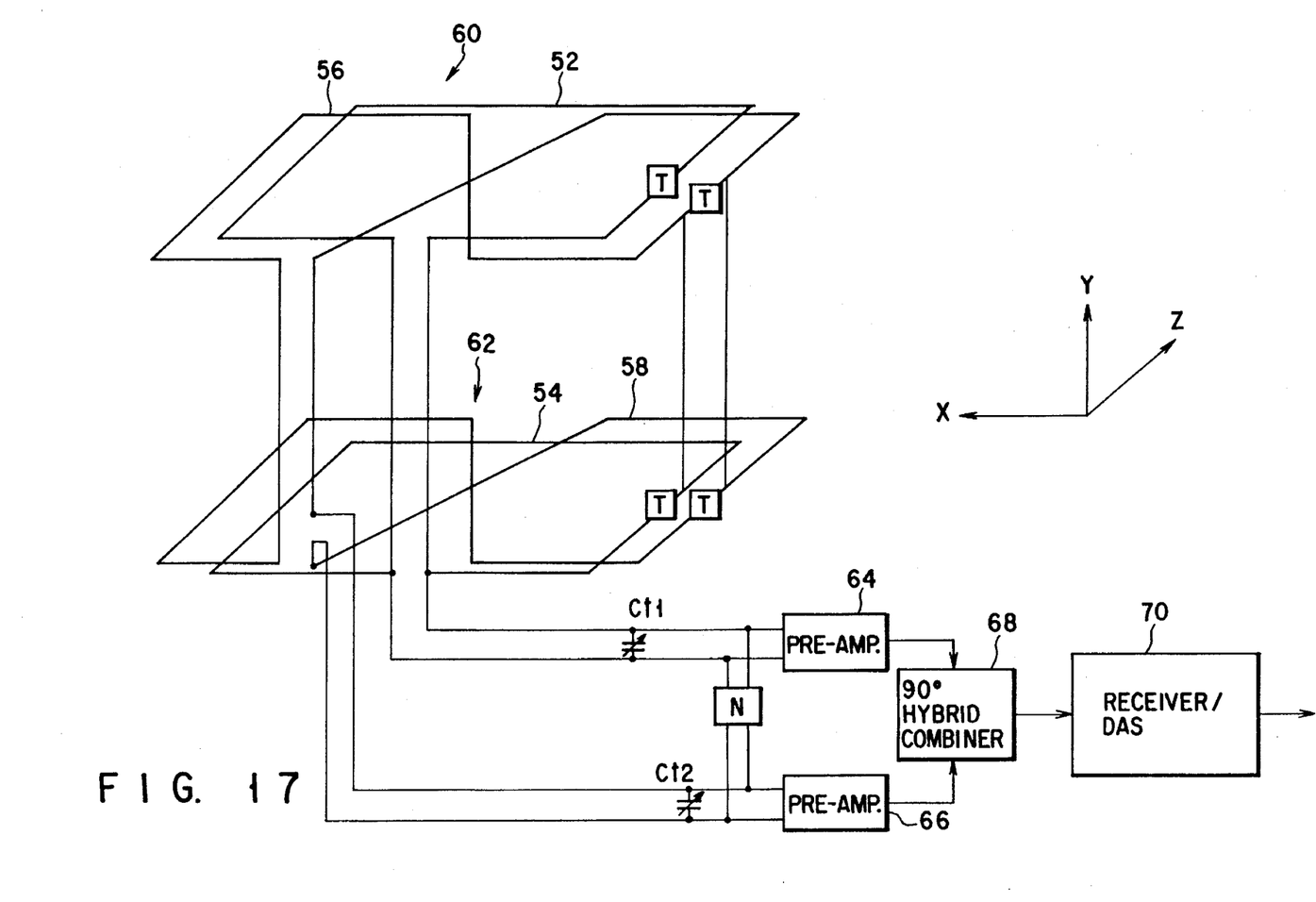
FIG. 17 is a diagram showing another modification of the RF coil-pair assembly of the third embodiment.

Furthermore, the third embodiments can be modified as shown in FIG. 17. In FIG. 12, power is supplied to the upper and lower coils at the end portions thereof in the X direction. However, power may be supplied to the coils at the central portions in the X direction and at the end portions in the z-axis direction, as shown in FIG. 17. With this arrangement, the power supply lines and a structure surrounding them and connecting the upper and lower coils are located at a crotch of the object. This arrangement is suitable for imaging the prostate and cervix uteri.

As has been described above, the present invention comprises a pair of 8-shaped coils sandwiching the object, and means, connected to the pair of 8-shaped coils, for detecting a magnetic resonance signal from the object. Since the sensitivity region can cover only a partial ROI without covering the entire object, imaging of a small local portion can be performed with a high S/N ratio. Since an RF magnetic field perpendicular to a static magnetic field can be generated regardless of whether the static magnetic field is in the vertical or horizontal direction, the present invention can be applied to both MRI systems having the horizontal and vertical magnetic fields.

Also, the present invention comprises a pair of 8-shaped coils sandwiching the object, a pair of the rectangular or circular coils sandwiching the object so as to generate a magnetic field in the object which is perpendicular to a magnetic field generated by the pair of 8-shaped coils, means, connected to the pair of 8-shaped coils and the pair of rectangular or circular coils, for respectively detecting magnetic resonance signals from the object, and means for shifting the phase of one of the pair of 8-shaped coil and the pair of rectangular or circular coils from the phase of the other by 90° and summing two outputs therefrom, thereby obtaining one composite detection signal. Since the sensitivity region can cover only a partial ROI without covering the entire object, imaging of a small local portion can be performed with a high S/N ratio.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, in the above description, a pair of coils are arranged to oppose each other through the object. However, a pair of arrays of small coils may be arranged to oppose each other. With this arrangement, the S/N ratio can be further increased. The third embodiment can be modified as in the second embodiment by setting the gap between the upper coil and the lower coil larger at portions closer to the right and let end portions of the object thus narrowing the central portion of the coils.

What is claimed is:

1. A magnetic resonance imaging apparatus comprising:
    a pair of 8-shaped coils sandwiching an object for providing a magnetic field within a plane parallel to the coils and in a direction perpendicular to an axis of the object; and
    means for connecting said pair of 8-shaped coils such that said pair of 8-shaped coils detects a magnetic resonance signal from the object.

2. An apparatus according to claim 1, wherein at least one of said pair of 8-shaped coils has a convex shape with respect to the object so that a gap between said pair of 8-shaped coils is smallest at a central portion.

3. An apparatus according to claim 1, wherein a gap between said pair of 8-shaped coils is smallest at a central portion and the gap is set larger at portions closer to both end portions of the object in a lateral direction.

4. An apparatus according to claim 1, wherein said pair of 8-shaped coils are connected to each other at an end portion, and one of said pair of 8-shaped coils is pivotal to the other of said pair of 8-shaped coils to be opened and closed at the end portion.

5. An apparatus according to claim 1, wherein said pair of 8-shaped coils are mounted to the object at a side portion.

6. An apparatus according to claim 5, wherein a length of said pair of 8-shaped coils is smaller than a width of the object.

7. An apparatus according to claim 1, wherein said pair of 8-shaped coils are mounted to the object at a crotch.

8. An apparatus according to claim 1, wherein said connecting means connects said pair of 8-shaped coils such that a current flows in an opposite direction at corresponding portions of the pair of 8-shaped coils.

9. A magnetic resonance imaging apparatus comprising:
    a pair of coils sandwiching an object for providing a magnetic field within a plane parallel to the coils and in a direction perpendicular to an axis of the object; and
    means for connecting said pair of coils such that said pair of coils detects a magnetic resonance signal from the object.

10. An apparatus according to claim 9, wherein at least one of said pair of coils has a convex shape with respect to the object so that a gap between said pair of loop coils is smallest at a central portion.

11. An apparatus according to claim 9, wherein a gap between said pair of coils is smallest at a central portion and the gap is set larger at portions closer to both end portions of the object in a lateral direction.

12. An apparatus according to claim 9, wherein said pair of coils are connected to each other at an end portion, and one of said pair of coils is pivotal to the other of said pair of coils to be opened and closed at the end portion.

13. An apparatus according to claim 9, wherein said pair of coils are mounted to a side portion of the object.

14. An apparatus according to claim 13, wherein a length of said pair of loop coils is smaller than a width of the object.

15. An apparatus according to claim 9, wherein said pair of loop coils are mounted to the object at a crotch.

16. An apparatus according to claim 9, wherein said connecting means connects said pair of coils such that a current flows in an opposite direction at corresponding portions of the pair of coils.

17. A magnetic resonance imaging apparatus comprising:
a pair of first coils arranged to sandwich an object for providing a magnetic field in a predetermined direction in the object;
a pair of second coils arranged to sandwich the object for providing a magnetic field in a direction perpendicular to the predetermined direction in the object;
means for connecting the pair of said first coils such that the pair of said first coils detects a first magnetic resonance signal from the object;
means for connecting the pair of said second coils such that the pair of said second coils detects a second magnetic resonance signal from the object; and
means for shifting a phase of one of an output of the pair of said first coils and an output of the pair of said second coils by 90° and summing a shifted output and the other of an output of the pair of said first coils and an output of the pair of said second coils, thereby providing a single detection signal.

18. An apparatus according to claim 17, wherein said pair of first coils is a pair of 8-shaped coils and said pair of second coils is a pair of rectangular coils.

19. An apparatus according to claim 17, wherein said pair of first coils is a pair of 8-shaped coils and said pair of second coils is a pair of circular coils.

20. An apparatus according to claim 17, wherein said pair of first coils are connected to each other at an end portion, one of said pair of first coils is pivotal to be opened and closed at the end portion, said pair of second coils are connected to each other at an end portion, and one of said pair of second coils is pivotal to be opened and closed at the end portion.

21. An apparatus according to claim 17, wherein said pair of first and second coils are mounted to a side portion of the object.

22. An apparatus according to claim 21, wherein a length of said pair of first and second coils is smaller than a width of the object.

23. An apparatus according to claim 17, wherein said pair of first and second coils are mounted to the object at a crotch.

24. An apparatus according to claim 15, wherein
said means for connecting the pair of said first coils connects the pair of said first coils such that a current flows in an opposite direction at corresponding portions of the pair of said first coils, and
said means for connecting the pair of said second coils connects the pair of said second coils such that a current flows in the same direction at corresponding portions of the pair of said second coils.

25. An apparatus according to claim 15, wherein
said means for connecting the pair of said first coils connects the pair of said first coils such that a current flows in the same direction at corresponding portions of the pair of said first coils, and
said means for connecting the pair of said second coils connects the pair of said second coils such that a current flows in an opposite direction at corresponding portions of the pair of said second coils.

* * * * *